US010502759B2

(12) United States Patent
Geisberger

(10) Patent No.: US 10,502,759 B2
(45) Date of Patent: Dec. 10, 2019

(54) MEMS DEVICE WITH TWO-STAGE MOTION LIMIT STRUCTURE

(71) Applicant: NXP USA, Inc., Austin, TX (US)

(72) Inventor: Aaron A. Geisberger, Austin, TX (US)

(73) Assignee: NXP USA, Inc., Austin, TX (US)

( * ) Notice: Subject to any disclaimer, the term of this patent is extended or adjusted under 35 U.S.C. 154(b) by 143 days.

(21) Appl. No.: 15/791,673

(22) Filed: Oct. 24, 2017

(65) Prior Publication Data

US 2019/0120872 A1 Apr. 25, 2019

(51) Int. Cl.
*G01P 15/125* (2006.01)
*G01P 15/08* (2006.01)

(52) U.S. Cl.
CPC .... *G01P 15/125* (2013.01); *G01P 2015/0871* (2013.01)

(58) Field of Classification Search
CPC .............................................. G01P 2015/0871
See application file for complete search history.

(56) References Cited

U.S. PATENT DOCUMENTS

| 6,865,944 | B2 | 3/2005 | Glenn et al. | |
| 8,011,247 | B2 | 9/2011 | Glenn | |
| 2013/0068022 | A1* | 3/2013 | Jeung | G01C 19/56 73/514.29 |
| 2013/0299923 | A1* | 11/2013 | Classen | B81B 3/0018 257/415 |
| 2014/0020613 | A1 | 1/2014 | Woo | |
| 2014/0144235 | A1* | 5/2014 | Suzuki | G01P 15/125 73/514.32 |
| 2014/0260613 | A1* | 9/2014 | Qiu | G01C 19/5733 73/504.15 |

OTHER PUBLICATIONS

Naumann, Michael et al; "Design and Application of Flexible Stops for MEMS Devices." IEEE Sensors Conference; 6 pages; (2010).
Yoon, Sang won et al; "Shock-Protection Improvement Using Integrated Novel Shock-Protection Technologies"; J. of Microelectromechanical Systems, vol. 20, No. 4; 16 pages (Aug. 2011).

* cited by examiner

*Primary Examiner* — Paul M. West
*Assistant Examiner* — Mark A Shabman
(74) *Attorney, Agent, or Firm* — Charlene R. Jacobsen

(57) ABSTRACT

A MEMS device includes a substrate, a proof mass capable of moving relative to the substrate, and a motion limit structure. The motion limit structure includes an arm structure flexibly coupled to the proof mass or the substrate. The arm structure has a first contact region and a second contact region. In response to a shock force that causes the proof mass to move, the first contact region contacts a first stop region on the other one of the proof mass and the substrate. Following contact of the first contact region with the first stop region and upon continuation of the shock force, the second contact region contacts a second stop region on the other one of the proof mass and the substrate such that the contact between the second contact and stop regions reduces a contact force between the first contact and stop regions.

15 Claims, 10 Drawing Sheets

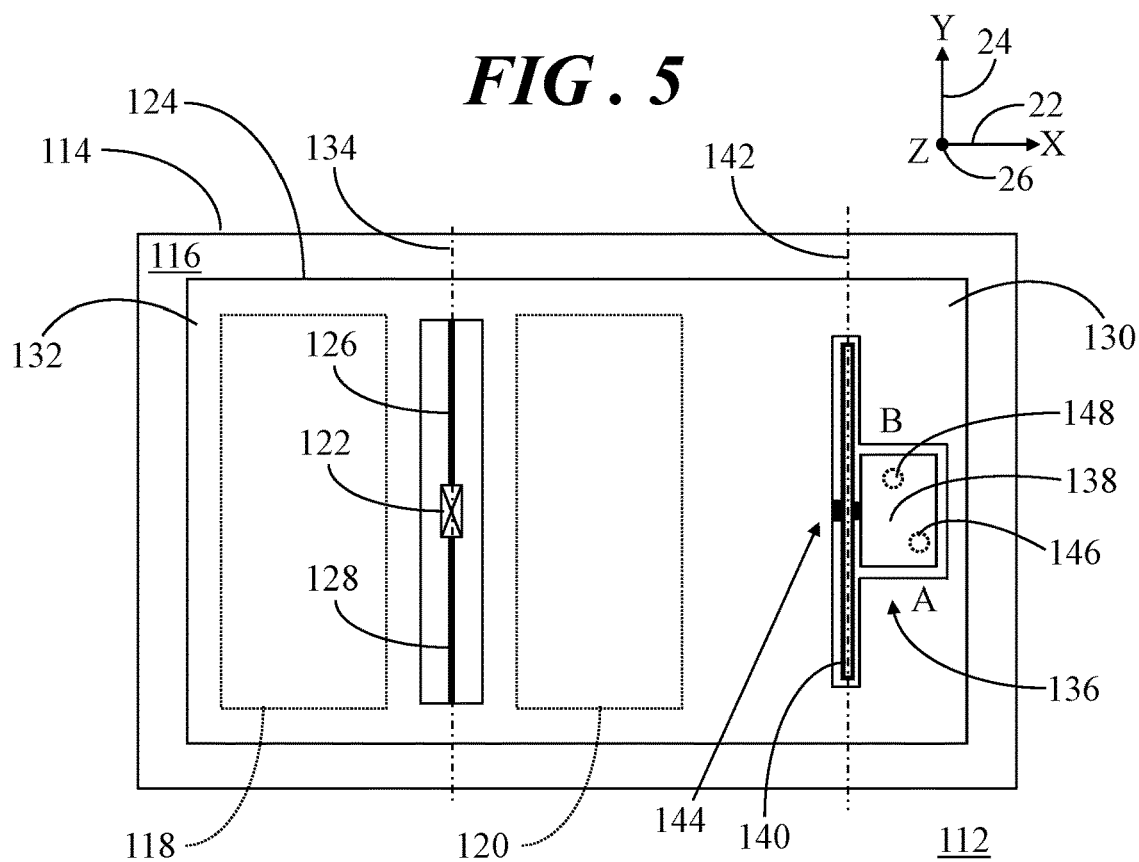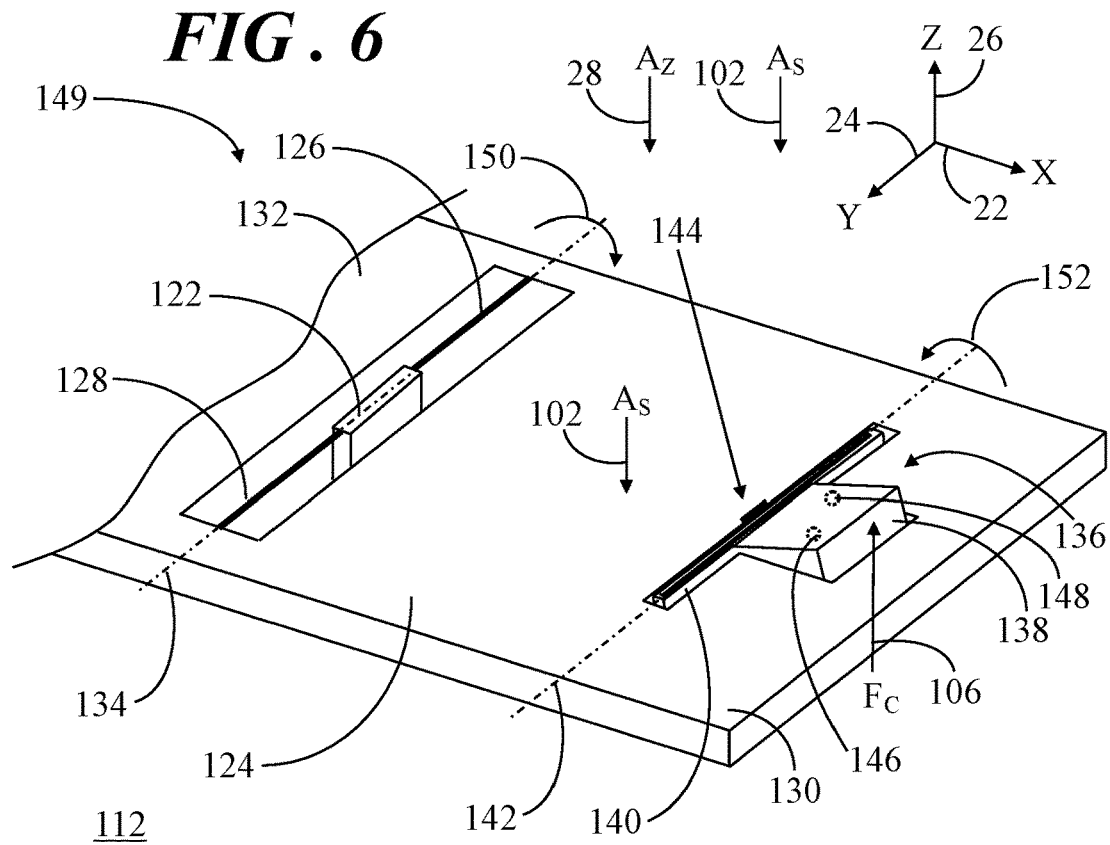

MEMS DEVICE WITH TWO-STAGE MOTION LIMIT STRUCTURE

TECHNICAL FIELD OF THE INVENTION

The present invention relates generally to microelectromechanical systems (MEMS) devices. More specifically, the present invention relates to a two-stage motion limit structure for restricting undesired motion of the movable parts of a MEMS inertial sensor resulting from external forces.

BACKGROUND OF THE INVENTION

Microelectromechanical Systems (MEMS) devices, such as MEMS sensors, are widely used in applications such as automotive, inertial guidance systems, household appliances, protection systems for a variety of devices, and many other industrial, scientific, and engineering systems. Such MEMS sensors are used to sense a physical condition such as acceleration, pressure, angular rotation, or temperature, and to provide an electrical signal representative of the sensed physical condition.

Capacitive MEMS inertial sensors, such as accelerometers, gyroscopes, and the like, typically include a movable mass that is suspended from a substrate. The movable mass moves, i.e., rotates or translates depending upon the design and sensing direction, in response to an external force. Motion of the movable mass results in a change in electrical capacitance, with respect to the sensed force, to vary the output of an energized circuit. MEMS inertial sensors are often subject to high acceleration forces, referred to herein as shock events, in off-axis directions. Unfortunately, the spring suspension designs used to suspend a movable mass may not be robust to such shock events leading to device failure.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

FIG. 5 shows a top view of a MEMS inertial sensor in accordance with an embodiment;

FIG. 6 shows a partial perspective view of the MEMS inertial sensor of FIG. 5;

DETAILED DESCRIPTION

Figure 1:
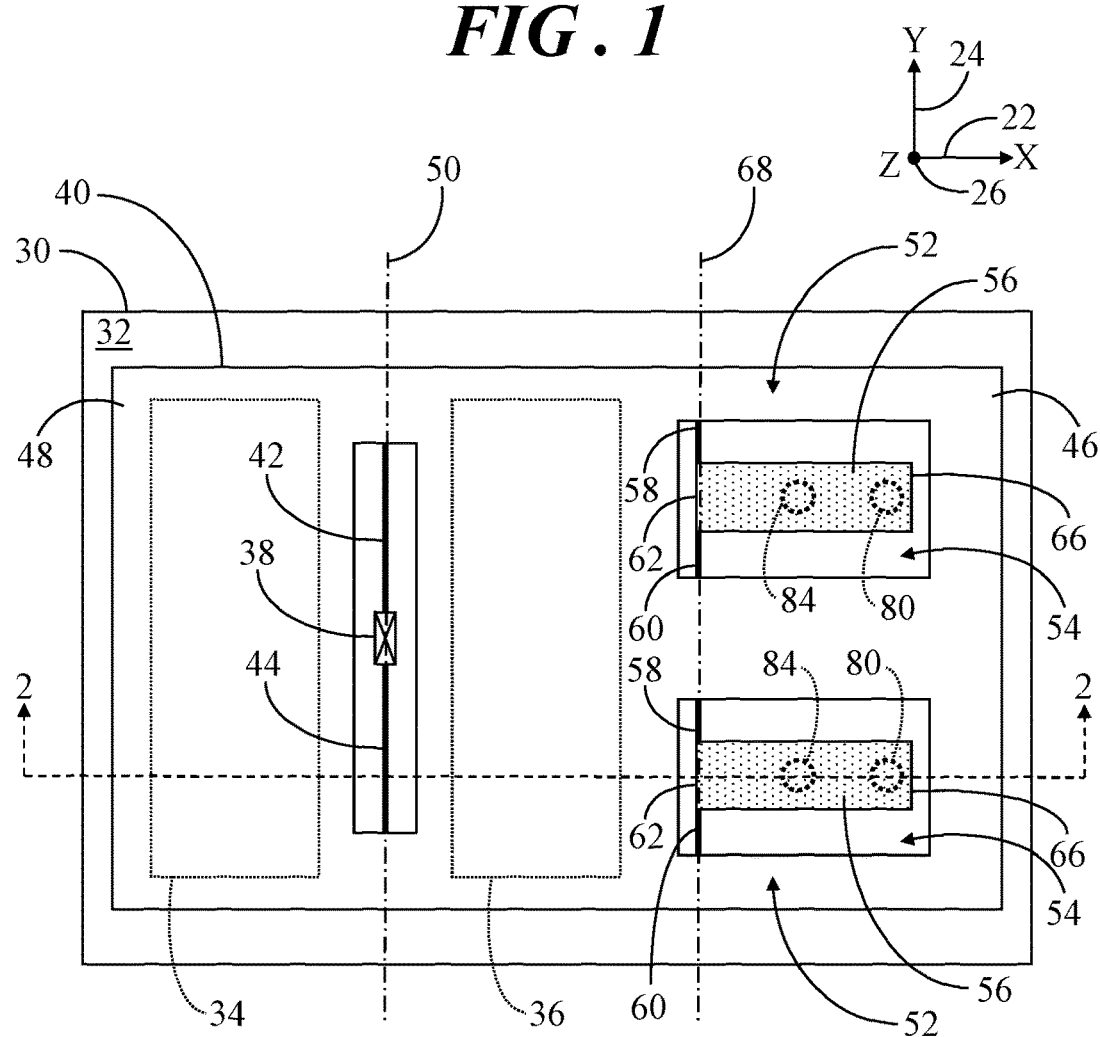
FIG. 1 shows a top view of a microelectromechanical (MEMS) inertial sensor in accordance with an embodiment.

In overview, the present disclosure concerns microelectromechanical systems (MEMS) devices with improved robustness to excess external acceleration forces, referred to herein as shock events. More particularly, a MEMS inertial sensor includes one or more motion limit structures having a two-stage motion limit configuration. The two-stage motion limit structure includes a primary stop feature that makes contact between movable and stationary structures. This primary stop feature (i.e., the first stop stage) has compliance configured to prevent considerable forces being generated between the contact surfaces of the movable and stationary structures. Keeping the contact forces low helps to keep the adhesion force between the contact surfaces of the movable and stationary structures low. The secondary stop feature (i.e., the second stop stage) is more rigid and is configured to stop movement of the moveable structure relative to the stationary structure with higher forces. Additionally, the secondary stop feature is configured to withstand sufficient forces and may therefore limit or reduce the contact force between the contact surface of the movable and stationary structures of the primary stop feature. The energy used to compress the primary stop feature can be used to push apart the secondary stop feature. Accordingly, the two-stage stop configuration may reduce the potential for damage to the movable structures and/or the stop features during high-g shock events, and enable the reduction of contact forces between the contact surface of the primary stop feature to thereby limit stiction events (i.e., the permanent adhesion of the movable structures to the stationary structures). Thus, the two-stage stop configuration having a compliant primary stop feature and a rigid secondary stop feature may result in enhanced performance and a more robust design of a MEMS device.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 2:
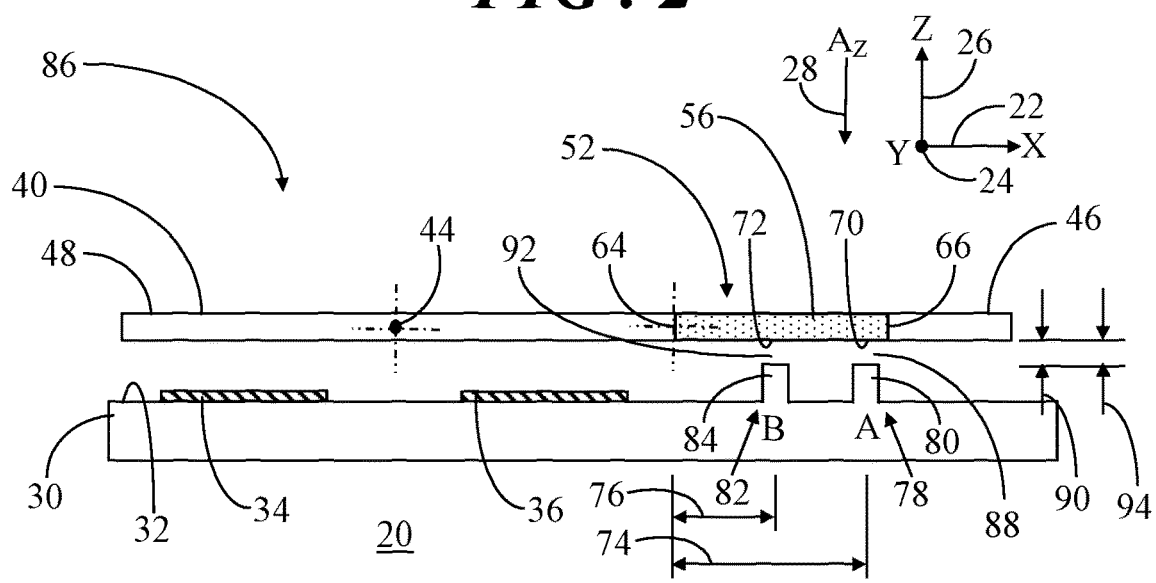
FIG. 2 shows a side view of the MEMS inertial sensor along section lines 2-2 of FIG. 1.

Referring to FIGS. 1 and 2, FIG. 1 shows a top view of a microelectromechanical (MEMS) inertial sensor 20 in accordance with an embodiment and FIG. 2 shows a side view of MEMS inertial sensor 20 along section lines 2-2 of FIG. 1. By convention, MEMS inertial sensor 20 is illustrated as having a generally planar structure within an X-Y plane, where an X-axis 22 extends rightwardly and leftwardly in FIGS. 1 and 2, a Y-axis 24 extends upwardly and downwardly in FIG. 1, and a Z-axis 26 extends upwardly and downwardly in FIG. 2. In this example, MEMS inertial sensor 20 is in the form of an accelerometer and is constructed as a "teeter-totter" type sensor. As such, MEMS inertial sensor 20 is adapted to sense acceleration, and in particular, Z-axis acceleration, $A_Z$, represented by an arrow 28 in FIG. 2. MEMS device 20 will be referred to hereinafter as Z-axis accelerometer 20.

Z-axis accelerometer 20 includes a substrate 30 having a generally planar surface 32. Electrode elements 34, 36 and a suspension anchor 38 are formed on planar surface 32 of substrate 30. The physical coupling of suspension anchor 38 to substrate 30 is denoted by an "X" extending through anchor 38. A movable structure, referred to herein as a proof mass 40, is positioned in spaced apart relationship above planar surface 32 of substrate 30. More particularly, torsion beams 42, 44 are coupled between suspension anchor 38 and proof mass 40, and are positioned in spaced apart relationship above planar surface 32 of substrate 30. Together, suspension anchor 38 and torsion beams 42, 44 function to suspend proof mass 40 from surface 32 of substrate 30 so that an airgap exists between proof mass 40 and electrode elements 34, 36 (best seen in FIG. 2).

Suspension anchor 38 and torsion beams 42, 44 are shown in highly simplified form for illustrative purposes. Those skilled in the art will recognize that suspension anchor 38 and torsion beams 42, 44 can be implemented with a wide variety of different types of spring elements. It should be observed that electrode elements 34, 36 are obscured from view in FIG. 1 by the overlying proof mass 40. As such, electrode elements 34, 36 are represented in FIG. 1 by dotted line boxes. In FIG. 2, electrode elements 34, 36 are visible and they are shaded by a rightwardly and downwardly hatched pattern for illustrative purposes. The components of MEMS sensor 20 may be formed using existing and upcoming MEMS fabrication design rules and processes that include, for example, deposition, patterning, and etching.

Proof mass 40 has a first section 46 and a second section 48 on opposing sides of an axis of rotation 50 (referred to herein as a first axis of rotation 50). When intended for operation as a teeter-totter type accelerometer, first section 46 of proof mass 40 is formed with relatively greater mass than second section 48 of proof mass 40. In this example, the difference in mass between first and second sections 46, 48 may be created by offsetting first axis of rotation 50 such that first section 46 is longer than second section 48. In alternative embodiments, this difference in mass may be accomplished by adding mass to first section 46 through an additional layer of material, by removing mass from second section 48 relative to first section 46, and so forth. Proof mass 40 is adapted for rotation about first axis of rotation 50 in response to Z-axis acceleration 28, thus changing its position relative to the underlying sensing electrode elements 34, 36. This change in position results in a set of capacitances whose difference, i.e., a differential capacitance, is indicative of the magnitude of acceleration 28.

In accordance with an embodiment, Z-axis accelerometer 20 includes one or more two-stage motion limit structures 52 (two shown) located in openings 54 extending through first section 46 of proof mass 40. Each motion limit structure 52 includes an arm structure 56 flexibly coupled to proof mass 40 via torsion springs 58, 60. Arm structure 56 is a cantilevered structure having a first end 62 that is coupled to proof mass 40 via torsion springs 58, 60 at a pivot location 64 (denoted in FIG. 2) and an unconstrained second end 66. Accordingly, arm structure 56 is configured to pivot about a second axis of rotation 68 at pivot location 64. Second axis of rotation 68 is oriented parallel to first axis of rotation 50 of proof mass 40 and is displaced away from first axis of rotation 50 in a direction aligned with X-axis 22 and therefore parallel to surface 32 of substrate 20. Arm structure 56 is shaded with a stippled pattern to more clearly distinguish it from proof mass 40.

Arm structure 56 further includes first and second contact regions 70, 72 (visible in FIG. 2). Both of first and second contact regions 70, 72 are laterally displaced away from pivot location 64 in a direction corresponding to X-axis 22. More particularly, first contact region 70 is displaced away from pivot location 64 along X-axis 22 by a first distance 74 and second contact region 72 is displaced away from pivot location 64 along X-axis 22 by a second distance 76 that is less than first distance 74. Thus, second contact region 72 is at a position that is closer to pivot location 64 than the position of first contact region 70.

In this example, a first stop region 78 (labeled "A" in FIG. 2) is formed with a first bump 80 on surface 32 of substrate 30 that extends toward first contact region 70. Similarly, a second stop region 82 (labeled "B" in FIG. 2) is formed with a second bump 84 on surface 32 of substrate 30 that extends toward second contact region 72. In FIG. 2, proof mass 40 is illustrated in an initial (nonmoving) position 86. When proof mass 40 is in initial position 86, a first gap 88 having a first width 90 exists between first contact region 70 and first bump 80. Likewise, when proof mass 40 is in initial position 86, a second gap 92 having a second width 94 exists between second contact region 72 and second bump 84. First and second bumps 80, 84 are illustrated as being of equal height. Therefore, first and second widths 90, 94 are substantially the same. It should be understood, however, that first and second bumps 80, 84 may be of differing heights in accordance with a particular design configuration. Therefore, first and second widths 90, 94 may be different. Other alternative embodiments will be discussed below in connection with FIGS. 12-15.

Figure 3:
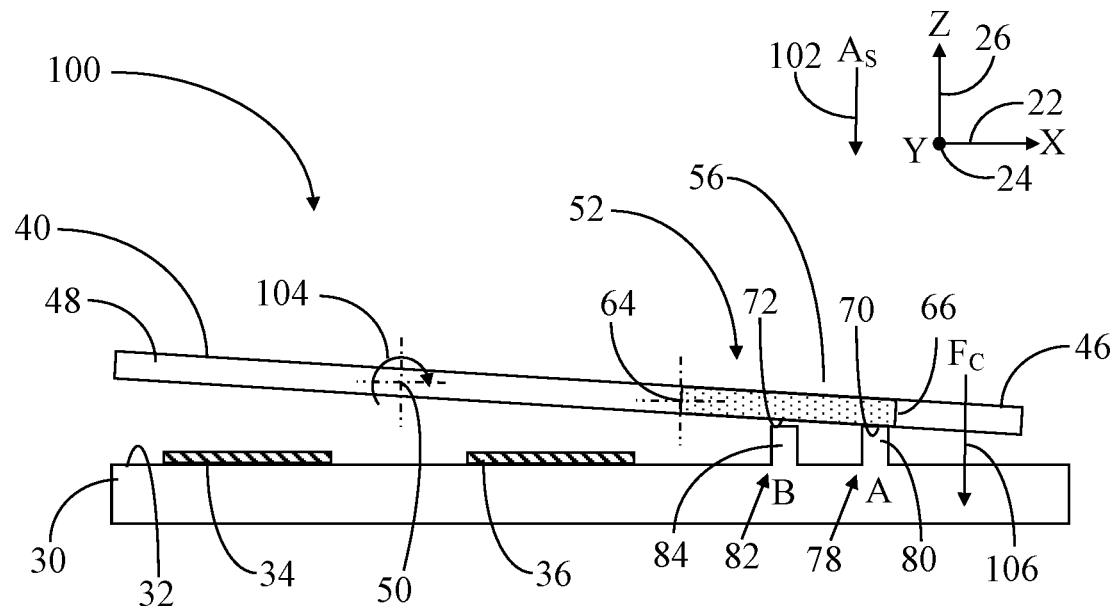
FIG. 3 shows the side view of the MEMS inertial sensor of FIG. 2 at a first stop stage.

FIG. 3 shows the side view of MEMS inertial sensor, i.e. Z-axis accelerometer 20, at a first stop stage 100 in accordance with a two-stage configuration of motion limit structure 52. In particular, FIG. 3 shows proof mass 40 being subjected to a Z-axis shock force, $A_S$, represented by an arrow 102 in FIG. 3. When proof mass 40 is subjected to Z-axis shock force 102, proof mass 40 will pivot about first axis of rotation 50, as denoted by an arrow 104. In response to shock force 102 imposed upon proof mass 40 that causes proof mass 40 to pivot, first contact region 70 will contact first bump 80 at first stop region 78 with a particular force, referred to herein as a contact force, $F_C$, and represented by a downwardly directed arrow 106. Thus, first contact region 70 and first stop region 78 can be considered a primary stop feature (A).

Figure 4:
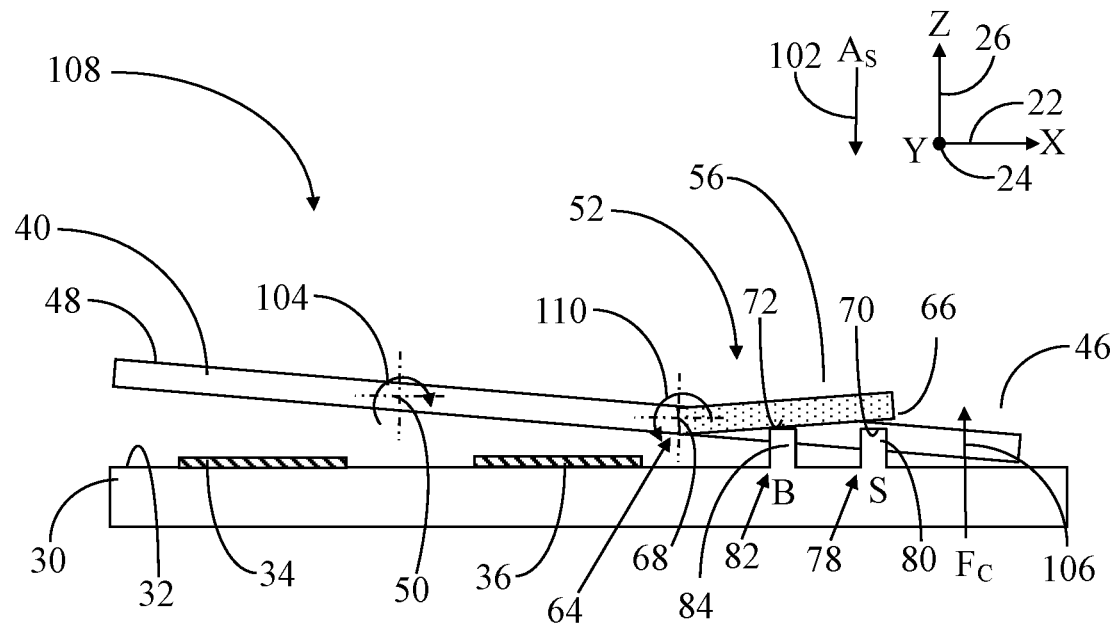
FIG. 4 shows the side view of the MEMS inertial sensor of FIG. 3 at a second stop stage.

Referring now to FIG. 4, FIG. 4 shows the side view of the MEMS inertial sensor, i.e. Z-axis accelerometer 20, at a second stop stage 108 in accordance with the two-stage configuration of motion limit structure 52. In particular, FIG. 4 shows that following contact of first contact region 70 with first bump 80 at first stop region 78 and upon a continuation of shock force 102 imposed upon proof mass 40, second contact region 72 will contact second bump 84 at second stop region 80. The forcible contact of second contact region 72 with second bump 84 causes arm structure 56 to pivot at pivot location 64 about second axis of rotation 68, as denoted by an arrow 110. Thus, second contact region 72 and second stop region 82 can be considered a secondary stop feature (B).

It can be observed in FIG. 4, that the pivoting motion of arm structure 56 is in an opposite direction relative to the pivoting motion of proof mass 40. The pivoting motion of arm structure 56 in response to contact of second contact region 72 with second bump 84 at second stop region 82 reduces the magnitude of contact force, $F_C$, 106, as represented by the upwardly directed arrow. Indeed, the reduction of contact force 106 can be sufficient to separate first contact region 70 from first bump 80, as shown. This approach limits the contact force on the primary stop position (A) to keep adhesion forces low between first contact region 70 and first bump 80 to thereby mitigate the problem of stiction (i.e., permanent adhesion of first contact region 70 and first bump 80) and/or damage to first bump 80. Additionally, the reduction of contact force 106 between first contact region 70 and first bump 80 yields a restoring force that can be sufficient to separate second contact region 72 from second bump 84 to return proof mass 40 to initial position 86 (FIG. 2).

Accordingly, motion limit structure 52 is a two-stage compliant stop that can reduce impact forces on the structures of both the primary and secondary stop features so as to limit the potential for damage to the structures (e.g., first and second bumps 80, 82), reduce the probability of stiction between contact regions and stop regions, and effectively return proof mass 40 to its initial position. The two-stage compliant motion limit structure 52 enables a geometric configuration in which the contact forces exerted on the primary stop feature (A) are reduced once the secondary stop feature (B) begins to engage.

Referring to FIGS. 5-6, FIG. 5 shows a top view of a MEMS inertial sensor 112 in accordance with an embodiment and FIG. 6 shows a partial perspective view of MEMS inertial sensor 112. Like Z-axis accelerometer 20 (FIG. 1), inertial sensor 112 is adapted to sense Z-axis acceleration, $A_Z$, 28 (FIG. 6) and is thus referred to hereinafter as Z-axis accelerometer 112.

Z-axis accelerometer 112 includes a substrate 114 having a generally planar surface 116. Electrode elements 118, 120 and a suspension anchor 122 are formed on planar surface 116 of substrate 114. A proof mass 124, is positioned in spaced apart relationship above surface 116 of substrate 114 via torsion beams 126, 128 coupled between suspension anchor 122 and proof mass 124. Proof mass 124 has a first section 130 and a second section 132 on opposing sides of a first axis of rotation 134. Like accelerometer 20, first section 130 of proof mass 124 is formed with relatively greater mass than second section 132 of proof mass 124. Thus, proof mass 124 is adapted for rotation about a first axis of rotation 134 in response to Z-axis acceleration 28, thereby changing its position relative to the underlying sensing electrode elements 118, 120.

The views of Z-axis accelerometer 112 presented in FIGS. 5-6, show a two-stage motion limit structure 136 having a cantilevered arm structure 138 cut from, and therefore surrounded by, proof mass 124. Further, a torsion spring 140 is flexibly coupled to proof mass 124 and enables pivoting motion of cantilevered arm structure 138 about a second axis of rotation 142 at a pivot location 144. Second axis of rotation 142 is oriented parallel to first axis of rotation 134 of proof mass 124 and is displaced away from first axis of rotation 134 in a direction aligned with X-axis 22 and therefore parallel to surface 116 of substrate 118.

In the top views of FIGS. 5 and 6, dotted line circles represent a first stop point 146, A, and a second stop point 148, B, of cantilevered arm structure 138. First stop point 146 represents first contact region 70 (FIG. 2) on arm structure 138 and first stop region 78 (FIG. 2) on the underlying substrate 114. First bump 80 (FIG. 2) may be formed at either of first contact region 70 or first stop region 78. Similarly, second stop point 148 represents second contact region 72 (FIG. 2) on arm structure 138 and second stop region 82 (FIG. 2) on the underlying substrate 114. Second bump 84 (FIG. 2) may be formed at either of second contact region 72 or second stop region 82.

With particular reference to FIG. 6, Z-axis accelerometer 112 is shown at a second stop stage 149 in accordance with the two-stage configuration of motion limit structure 136. In particular, proof mass 124 has rotated about first axis of rotation 134 in response to shock force 102, as denoted by an arrow 150. FIG. 6 further shows that following contact of cantilevered arm structure 138 with substrate 114 at first stop point 146 (primary stop feature) and upon continuation of shock force 102 imposed upon proof mass 124, cantilevered arm structure 138 will contact substrate 114 at second stop point 148 (secondary stop feature). The forcible contact at second stop point 148 causes cantilevered arm structure 138 to pivot at pivot location 144 about second axis of rotation 142, in a direction indicated by an arrow 152. The pivoting motion of cantilevered arm structure 138 is in an opposite direction relative to the pivoting motion of proof mass 124. The pivoting motion of cantilevered arm structure 138 in response to contact at second stop point 148 reduces the magnitude of force, $F_C$, 106 to effectively separate the structures at first stop point 146 and yields a restoring force sufficient to separate the structures at second stop point 148. FIG. 6 shows an exaggerated deformation (pivoting motion) of cantilevered arm structure 138 to highlight its rotation when flexing occurs at torsion spring 140.

In this example, first stop point 146 (as the primary stop feature) is displaced further away from second axis of rotation 142 than second stop point 148 (as the secondary stop feature). Additionally, first stop point 146 is offset in the Y-direction parallel to Y-axis 24. In other configurations, first stop point 146 may be aligned with second stop point 146 in the Y-direction. Still further, although first and second stop points 146, 148 include structures under cantilevered arm structure 138, in other configurations, stop points 146, 148 may be located above cantilevered arm structure 138 to contact an overhead structure (not shown). It should additionally be noted that a configuration may additionally incorporate a third rigid stop point to prevent excessive deflection of the proof mass.

Figure 7:
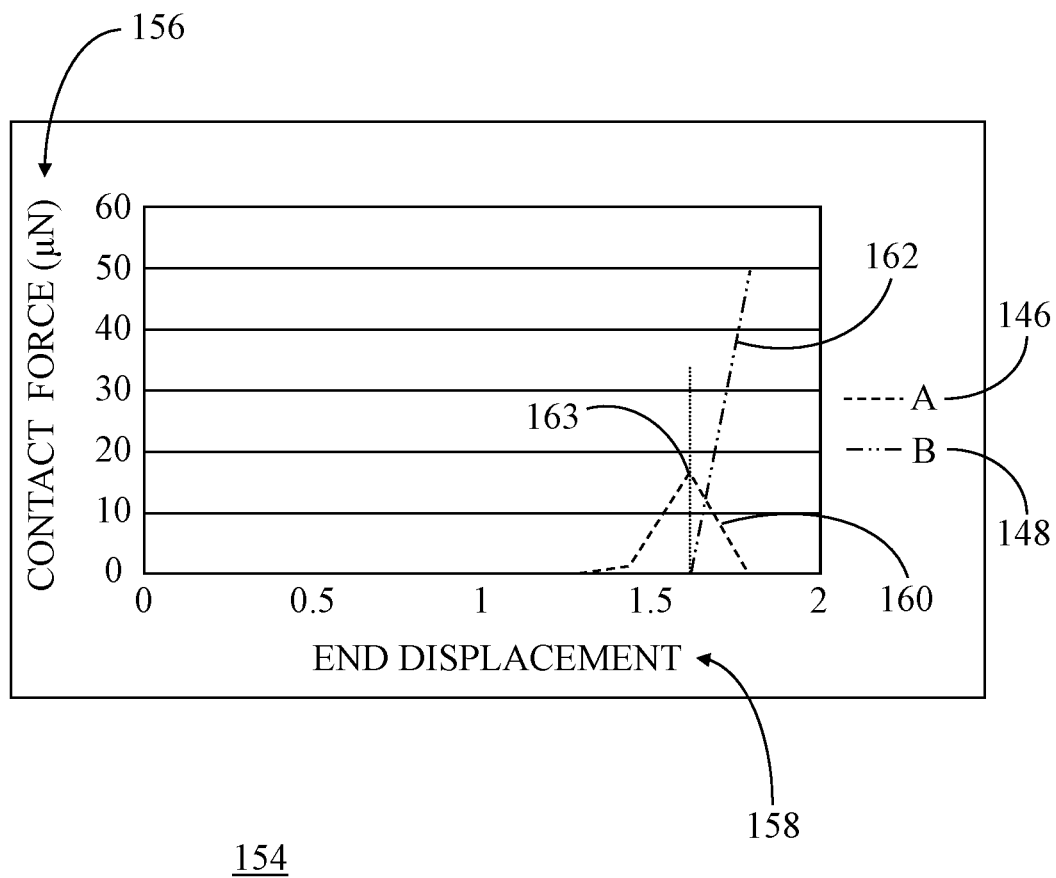
FIG. 7 shows a graph of example values of contact forces plotted for first and second stop points of the MEMS inertial sensor of FIGS. 5-6.

Referring concurrently to FIGS. 5-7, FIG. 7 shows a graph 154 of example values of contact forces 156 plotted for first and second stop points 146, 148 of Z-accelerometer 112 relative to a displacement 158 of proof mass 124. A first contact force profile 160 for first stop point 146, A, is represented by a dashed line and a second contact force profile 162 for second stop point 148, B, is represented by a dash-dot-dot line. In this example, displacement 158 of the end of first section 130 proof mass 124 along Z-axis 26 is tracked. As proof mass 124 pivots downward, as represented by arrow 150 in FIG. 6, contact is first made at first stop point 146, A.

As shown in graph 154, the contact force on first stop point 146 increases to approximately 15 micro Newtons (µN), then the contact force decreases. A peak contact force 163 at first stop point 146 occurs at the instant that second stop point 148, B, begins to make contact and relieves the contact force on first stop point 146. This is beneficial in that the contact force at first stop point 146 is kept relatively low for stiction robustness. Additionally, the 15 µN contact force is now available to separate cantilevered arm structure 138 from substrate 114 at second stop point 148. As can be observed in second contact force profile 162 for second stop point, as proof mass 124 rotates further, the contact force at second stop point 148 increases at a slope that is greater than the slope at first stop point 146. Accordingly, the two-stage motion limit structure 136 achieves two different stop stiffness values on a single cantilevered arm structure 138 in a Z-axis inertial sensor configuration.

Figure 8:
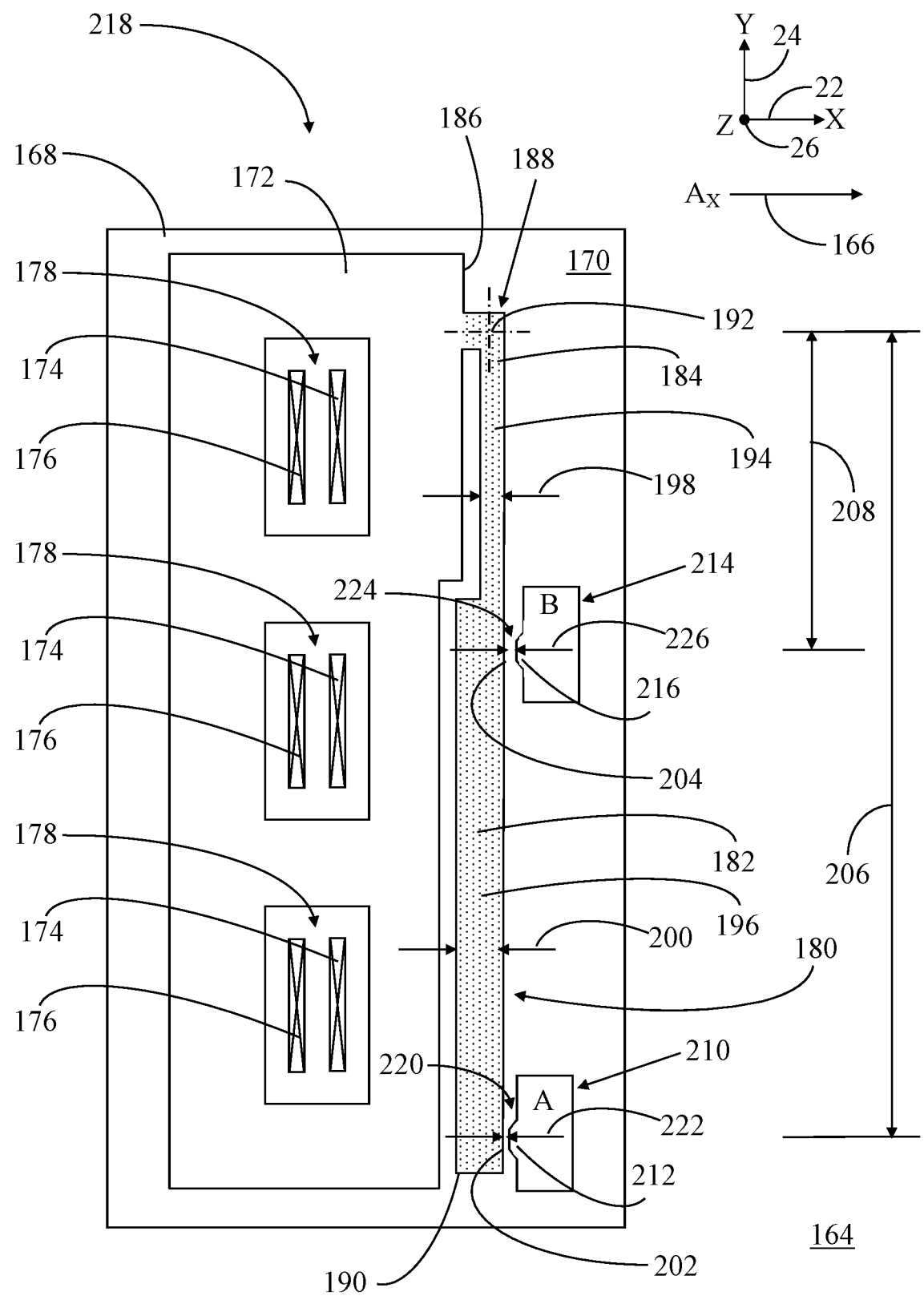
FIG. 8 shows, in a simplified and representative form, a top view of a microelectromechanical (MEMS) inertial sensor in accordance with another embodiment.

Referring now to FIG. 8, FIG. 8 shows, in a simplified and representative form, a top view of a microelectromechanical (MEMS) inertial sensor 164 in accordance with another embodiment. MEMS inertial sensors 20 (FIG. 1) and 112 (FIG. 5) are constructed as a "teeter-totter" type sensors. However, a two-stage motion limit structure may be configured to provide a two-stage lateral stop configuration. As such, in this example, MEMS inertial sensor is configured to sense acceleration in a lateral direction parallel to X-axis 22, and in particular, X-axis acceleration, $A_X$, represented by an arrow 166 in FIG. 8. MEMS inertial sensor 164 will thus be referred to hereinafter as X-axis accelerometer 164. Of course, the following discussion and structure applies equivalently to a MEMS inertial sensor that is configured to sense acceleration along Y-axis 24.

X-axis accelerometer 164 includes a substrate 168 having a generally planar surface 170. A proof mass 172 is spaced apart from substrate 168 by translatory spring suspension elements (not shown). Electrically-conductive electrode elements 174, 176 may be formed on surface 168 of substrate 166 and may be positioned within openings 178 extending through proof mass 172. During normal operation, the translatory spring suspension elements enable translational movement of proof mass 172 parallel to X-axis 22 relative to substrate 168 in response to X-axis acceleration 166, thus changing its position relative to the sensing electrode elements 174, 176. This change in position results in a set of capacitances whose difference, i.e., a differential capacitance, is indicative of the magnitude of X-axis acceleration 166.

In accordance with an embodiment, X-axis accelerometer 164 includes one or more two-stage motion limit structures 180 (one shown) located proximate proof mass 172. In the illustrated example, motion limit structure 180 includes an arm structure 182 (shaded with a stippled pattern to distinguish it from surrounding structures) flexibly coupled of proof mass 172. Arm structure 182 is a cantilevered structure having a first end 184 that is coupled to and extends from an edge 186 of proof mass 172 at a pivot location 188. Arm structure 182 further includes an unconstrained second end 190. Thus, pivot location 188 is at a junction between edge 186 of proof mass 172 and first end 184 of arm structure 182. Further, cantilevered arm structure 182 is configured to pivot about an axis of rotation 192 that is perpendicular to planar surface 170 of substrate 168.

Arm structure 182 includes a first segment 194 and a second segment 196 longitudinally extending from and aligned with first segment 194 so that first segment 194 is interposed between axis of rotation 192 and second segment 196. First segment 194 has a first width 198 parallel to the direction of movement of proof mass 172 (e.g., parallel to X-axis 22). Likewise, second segment 196 has a second width 200 parallel to the direction of movement of proof mass 172, in which second width 200 is greater than first width 198. The narrower first segment 194 is configured to act like a pivot to enable cantilevered arm structure 182 to pivot about axis of rotation 192. Additionally, the wider second segment 196 acts as a stop structure in a manner similar to the Z-axis design of FIGS. 1-6, and as discussed below. Although the relatively narrow configuration of first segment 194 enables cantilevered arm structure 182 to pivot about axis of rotation 192, first segment 194 can be implemented with a variety of different types of spring elements that enable the pivoting motion of cantilevered arm structure 182 about axis of rotation 192.

Second segment 196 of cantilevered arm structure 182 includes first and second contact regions 202, 204. Both of first and second contact regions 202, 204 are laterally displaced away from pivot location 188 in a direction corresponding to Y-axis 24. More particularly, first contact region 202 is displaced away from pivot location 188 along Y-axis 24 by a first distance 206 and second contact region 204 is displaced away from pivot location 188 along Y-axis 24 by a second distance 208 that is less than first distance 206. Thus, second contact region 204 is at a position that is closer to pivot location 188 than the position of first contact region 202.

In this example, a first stop region 210 (labeled "A" in FIG. 8) is formed with a first bump 212 on surface 170 of substrate 168 such that first bump 212 extends toward first contact region 202. Similarly, a second stop region 214 (labeled "B" in FIG. 8) is formed with a second bump 216 on surface 170 of substrate 168 such that second bump 216 extends toward second contact region 204. In FIG. 8, proof mass 172 is illustrated in an initial (nonmoving) position 218. When proof mass 172 is in initial position 218, arm structure 182 is likewise in an initial non-pivoting position. As such, a first gap 220 having a first width 222 exists between first contact region 202 and first bump 212. Likewise, a second gap 224 having a second width 226 exists between second contact region 204 and second bump 216. First bump 212 is illustrated as having a greater height than the height of second bump 216 extending toward second segment 196 of arm structure 182. Therefore, first width 222 is narrower than second width 226 in this example. It should be understood, however, that first and second bumps 212, 216 may be the same height in accordance with a particular design configuration.

Figure 9:
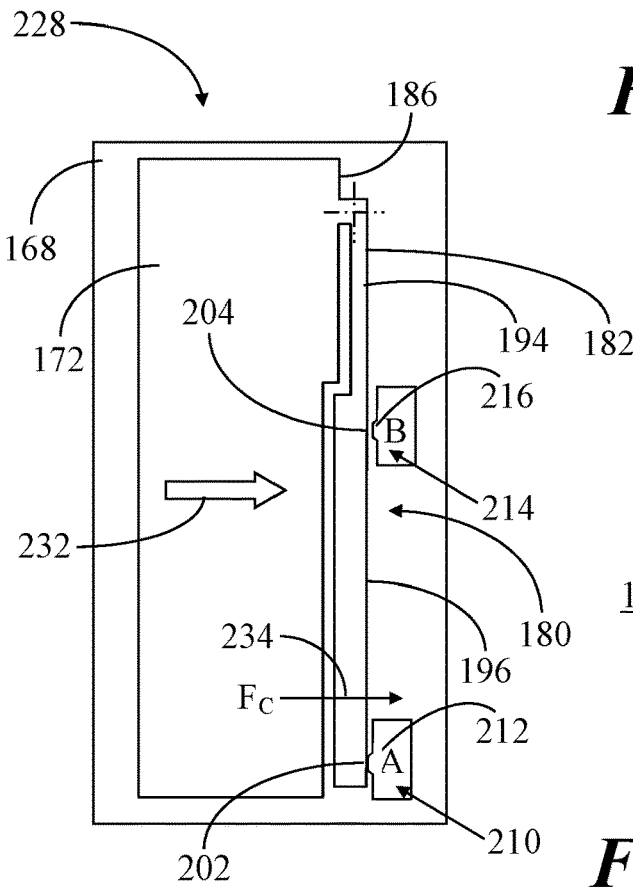
FIG. 9 shows a top view of the MEMS inertial sensor of FIG. 8 at a first stop stage.

FIG. 9 shows a top view of the MEMS inertial sensor, i.e., X-axis accelerometer 164, at a first stop stage 228 in accordance with a two-stage configuration of motion limit structure 180. In particular, FIG. 9 shows proof mass 172 being subjected to an X-axis shock force, $A_S$, represented by an arrow 230 in FIG. 9. When proof mass 172 is subjected to X-axis shock force 230, proof mass 172 will translate in a direction that may be substantially parallel to X-axis 22, as denoted by an arrow 232. In response to shock force 230 imposed upon proof mass 172 that causes proof mass 172 to translate, first contact region 202 at second segment 196 of arm structure 182 will contact first bump 212 at first stop region 210 with a particular force, referred to herein as a contact force, $F_C$, and represented by a rightwardly directed arrow 234. Thus, first contact region 202 and first stop region 210 can be considered a primary stop feature (A). It should be noted that electrodes 174, 176 (FIG. 8) are not depicted in FIG. 9 for simplicity.

Figure 10:
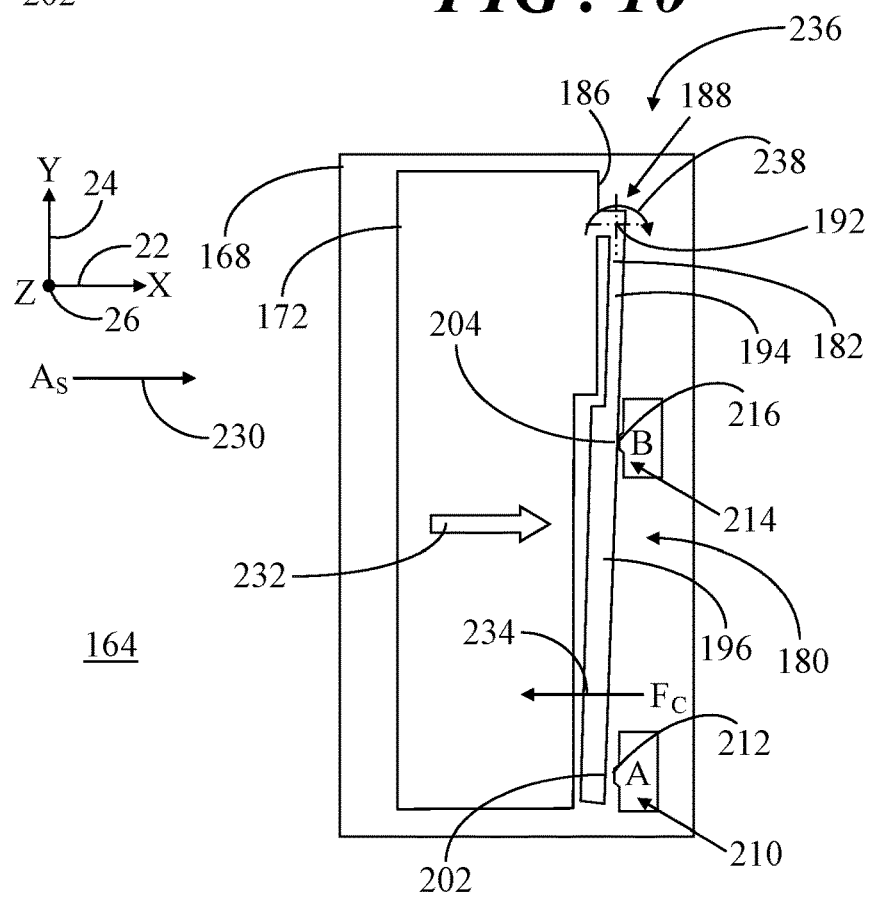
FIG. 10 shows a side view of the MEMS inertial sensor of FIG. 8 at a second stop stage.
Figure 11:
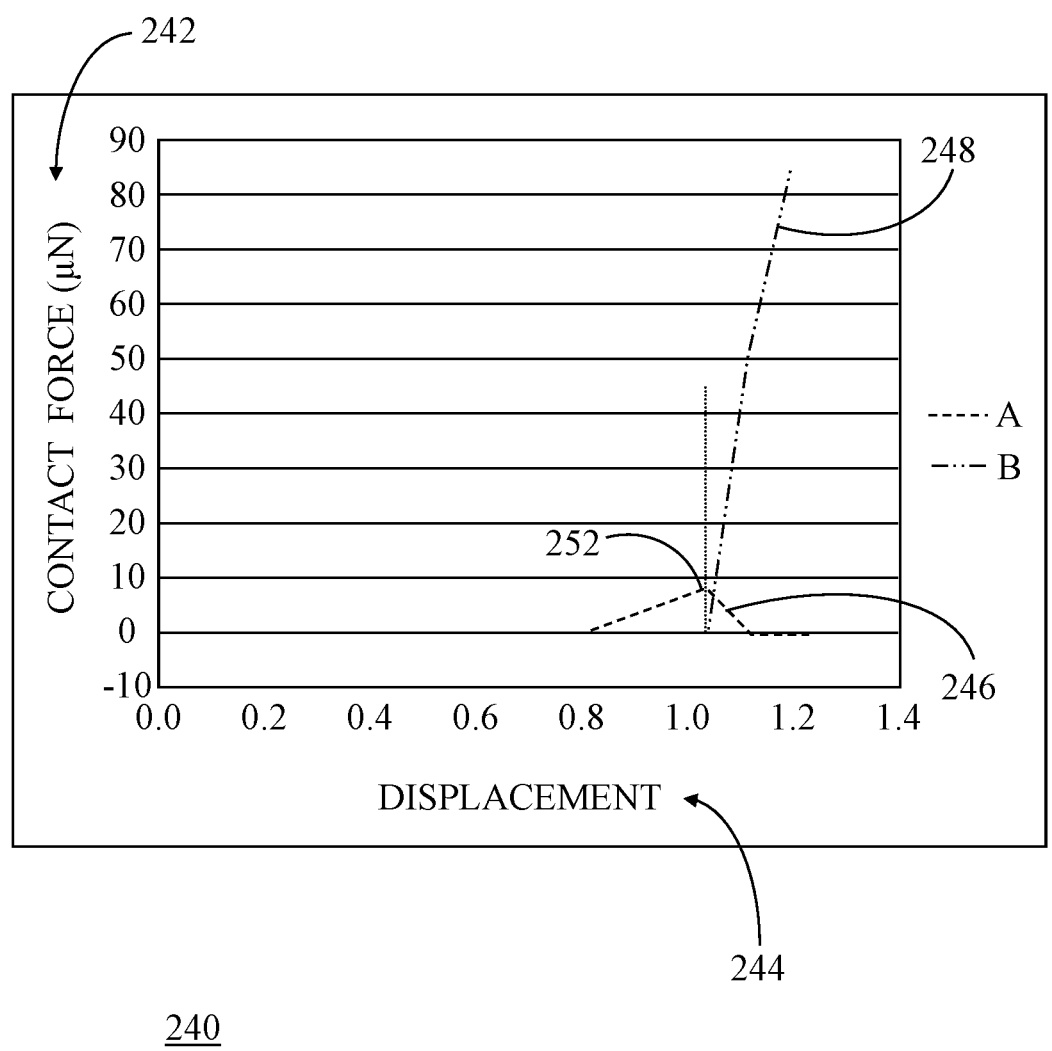
FIG. 11 shows a graph of example values of contact forces on first and second stop structures of the MEMS inertial sensor of FIGS. 8-10.

Referring now to FIG. 10, FIG. 10 shows the top view of the MEMS inertial sensor, i.e., X-axis accelerometer 164, at a second stop stage 236 in accordance with the two-stage configuration of motion limit structure 180. In particular, FIG. 10 shows that following contact of first contact region 202 with first bump 212 at first stop region 210 and upon continuation of shock force 230 imposed upon proof mass 172, second contact region 204 at second segment 196 of arm structure 182 will contact second bump 216 at second stop region 214. The forcible contact of second contact region 204 with second bump 216 causes arm structure 182 to pivot at pivot location 188 about axis of rotation 192, as denoted by an arrow 238. Thus, second contact region 204 and second stop region 214 can be considered a secondary stop feature (B). It should be noted that electrodes 174, 176 (FIG. 8) are not depicted in FIG. 9 for simplicity.

It can be observed in FIG. 10, that the pivoting motion of arm structure 182 in response to contact of second contact region 204 with second bump 216 at second stop region 214 reduces the magnitude of contact force, $F_C$, 234, as represented by the leftwardly directed arrow. The reduction of contact force 234 can be sufficient to separate first contact region 202 from first bump 212, as shown. This approach limits the contact force on the primary stop position (A) to keep adhesion forces low between first contact region 202 and first bump 212 to thereby mitigate the problem of stiction (i.e., permanent adhesion of first contact region 202 and first bump 212 and/or to reduce the potential for damage to bumps 212, 216 and electrode elements 174, 176 (FIG. 8). Additionally, the reduction of contact force 234 between first contact region 202 and first bump 212 yields a restoring force that can be sufficient to separate second contact region 204 from second bump 216 to return proof mass 172 to initial position 218 (FIG. 8).

Accordingly, motion limit structure 180 is a two-stage compliant stop that can reduce impact forces on the structures of both the primary and secondary stop features so as to limit the potential for damage to the structures (e.g., first and second bumps 212, 216 and electrode elements 174, 176), reduce the probability of stiction between contact regions and stop regions, and effectively return proof mass 172 to its initial position 218 (FIG. 8). The two-stage compliant motion limit structure 180 enables a geometric configuration in which the contact forces exerted on the primary stop feature (A) are reduced once the secondary stop feature (B) begins to engage.

Referring concurrently to FIGS. 8-11, FIG. 11 shows a graph 240 of example values of contact forces 242 for first and second stop points of the MEMS inertial sensor, e.g., X-axis accelerometer 164, relative to a translational displacement 244 of proof mass 172. The first stop point corresponds to the location at which first contact region 202 strikes first stop region 210, as the primary stop feature (A). The second stop point corresponds to the location at which second contact region 204 strikes second stop region 214, as the secondary stop feature (B). A first contact force profile 246 for the first stop point, A, is represented by a dashed line and a second contact force profile 248 for the second stop point, B, is represented by a dash-dot-dot line. In this example, translational displacement 244 of edge 186 of proof mass 172 along X-axis 22 is tracked. As proof mass 172 translates rightward, as represented by arrow 232 in FIG. 9, contact is first made at the first stop point, A.

As shown in graph 240, the contact force on the first stop point, represented by first contact force profile 246 increases to approximately 9 µN, then the contact force decreases. A peak contact force 252 occurs at the instant that the second stop point, B, represented by second contact force profile 248 begins to make contact and relieves the contact force on the first stop point, A. Like the situation with the Z-axis configuration described above, this keeps the contact force relatively low at the first stop point, A, for stiction robustness. Additionally, the 9 µN contact force is now available to separate cantilevered arm structure 182 from first and second bumps 212, 216 fixed to substrate 168. As can be observed in second contact force profile 248 for the second stop point, B, as proof mass 172 translates further, the contact force at the second stop point, B, increases at a slope that is greater than the force at first stop point, A. Accordingly, the two-stage motion limit structure 180 achieves two different stop stiffness values on one cantilevered arm structure 182 in a X- or Y-axis inertial sensor configuration.

Figure 12:
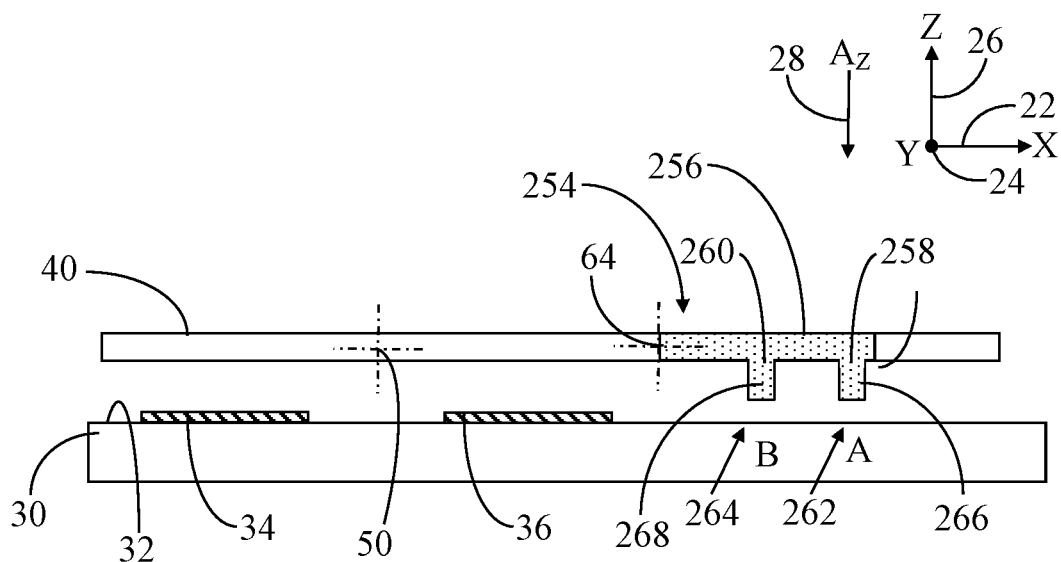
FIG. 12 shows a side view of a microelectromechanical (MEMS) inertial sensor in accordance with another embodiment.

FIG. 12 shows a side view of a microelectromechanical (MEMS) inertial sensor 252 in accordance with another embodiment. MEMS inertial sensor 252 is in the form of an accelerometer and is constructed as a "teeter-totter" type sensor and is configured to sense Z-axis acceleration, $A_Z$, 28. Z-axis accelerometer 252 includes many of the same structural components as those discussed in detail in connection with Z-axis accelerometer 20 of FIG. 1. Thus, a detailed description of these structural components will not be repeated herein for brevity. Accordingly, Z-axis accelerometer 252 includes substrate 30, electrode elements 34, 36, a suspension anchor (not shown), and proof mass 40 adapted for rotation about first axis of rotation 50 in response to Z-axis acceleration 28.

Z-axis accelerometer 20 includes one or more two-stage motion limit structures 254 (one shown) that may be located in openings extending through proof mass 40, as discussed above. Motion limit structure 254 includes a cantilevered arm structure 256 flexibly coupled to proof mass 40 via torsion springs (torsion springs 58, 60 of FIG. 1) at a pivot location (pivot location 64 of FIG. 2). Thus, arm structure 256 is configured to pivot about the second axis of rotation (second axis of rotation 68 of FIG. 1) at the pivot location 64.

Arm structure 256 further includes first and second contact regions 258, 260 which are laterally displaced away from pivot location 64 in the X-direction corresponding to X-axis 22. Additionally, and as discussed above, second contact region 260 is at a position that is closer to pivot location 64 than the position of first contact region 258. A first stop region 262 (labeled "A" in FIG. 12) is located on surface 32 of substrate 30 and a second stop region 264 (labeled "B" in FIG. 12 is located on surface 32 of substrate 30. In this example, a first bump 266 extends downwardly from first contact region 258 of arm structure 256 toward first stop region 262 on surface 32 of substrate 30 and a second bump 268 extends downwardly from second contact region 260 of arm structure 256 toward second stop region 264.

In this alternative Z-axis accelerometer configuration, the two-stage motion limit structure 254 functions similarly to the two-stage motion limit structures discussed above. That is, contact of first bump 266 at first contact region 258 with first stop region 262 is considered the more flexible primary stop feature (A) and contact of second bump 268 at second contact region 260 with second stop region 264 is considered the more rigid secondary stop feature (B).

Figure 13:
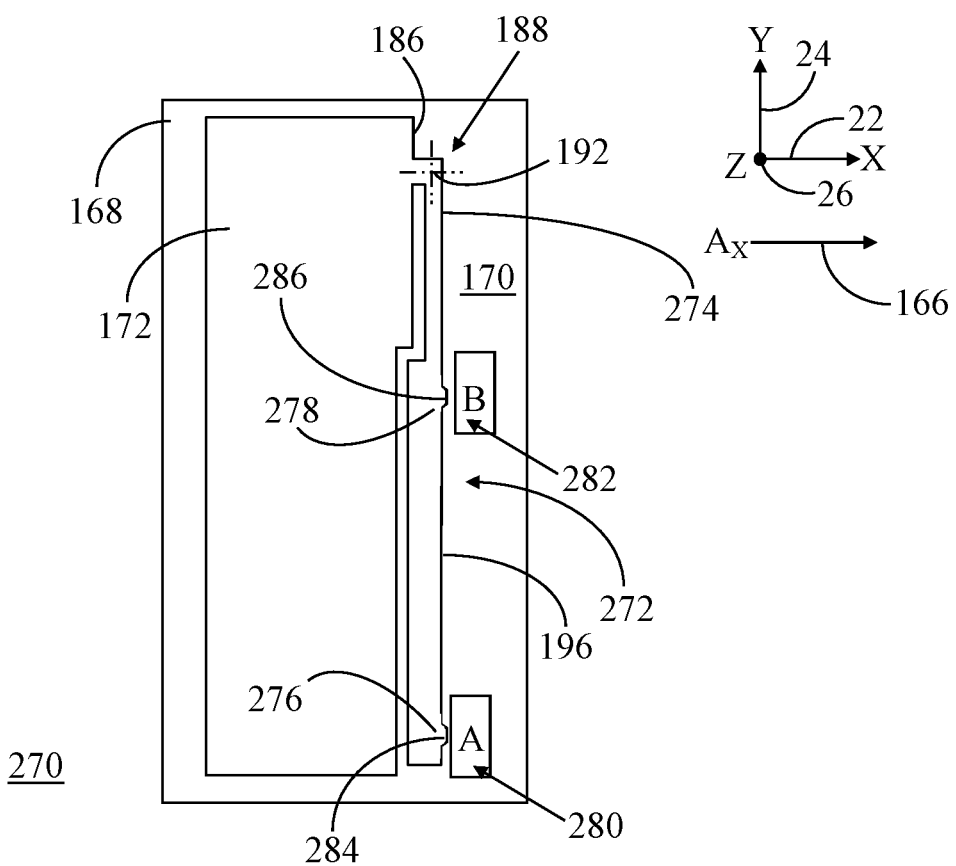
FIG. 13 shows a top view of a microelectromechanical (MEMS) inertial sensor in accordance with another embodiment.

FIG. 13 shows a top view of a microelectromechanical (MEMS) inertial sensor 270 in accordance with another embodiment. MEMS inertial sensor 270 is configured to sense X-axis acceleration, $A_X$, 166. X-axis accelerometer 270 includes many of the same structural components as those discussed in detail in connection with X-axis accelerometer 164 of FIG. 8. Thus, a detailed description of these structural components will not be repeated herein for brevity. Accordingly, X-axis accelerometer 270 includes substrate 168, electrode elements (e.g., electrode elements 174, 176 shown in FIG. 8), translatory spring suspension elements (not shown), and proof mass 172 adapted for translational (i.e., lateral motion in the X-direction parallel to X-axis 22) relative to substrate 168.

X-axis accelerometer 270 includes one or more two-stage motion limit structures 272 (one shown) located proximate proof mass 172. Motion limit structure 270 includes a cantilevered arm structure 274 flexibly coupled to proof mass 172. In particular, cantilevered arm structure 274 is coupled to and extends from edge 186 of proof mass 172 at pivot location 188. Thus, cantilevered arm structure 182 is configured to pivot about axis of rotation 192 that is perpendicular to planar surface 170 of substrate 168 at pivot location 188.

Arm structure 274 includes first and second contact regions 276, 278 which are laterally displaced away from pivot location 188 in a direction corresponding to Y-axis 24. A first stop region 280 (labeled "A" in FIG. 13) is formed on surface 170 of substrate 168 and a second stop region 282 (labeled "B" in FIG. 13) is formed on surface 170 of substrate 168. In this example, a first bump. In this example, a first bump 284 extends laterally from first contact region 276 of arm structure 274 toward first stop region 280 fixed to surface 170 of substrate 168 and a second bump 286 extends laterally from second contact region 278 of arm structure 274 toward second stop region 282 fixed to surface 170 of substrate 168.

In this alternative X-axis (or Y-axis) accelerometer configuration, the two-stage motion limit structure 272 functions similarly to the two-stage motion limit structures discussed above. That is, contact of first bump 284 at first contact region 276 with first stop region 280 is considered the more flexible primary stop feature (A) and contact of second bump 286 at second contact region 278 with second stop region 282 is considered the more rigid secondary stop feature (B).

The inertial sensors shown in FIGS. 1-6 and 8-10 demonstrate configurations in which the first and second bumps are formed at respective first and second stop regions on the substrate. Conversely, the inertial sensors shown in FIGS. 12 and 13 demonstrate configurations in which the first and second bumps are formed at respective first and second contact regions on the arm structure of the motion limit structure. In either instance, a two-stage motion limit (i.e., stop) configuration having a compliant primary stop feature (A) and a rigid secondary stop feature (B) is achieved.

Figure 14:
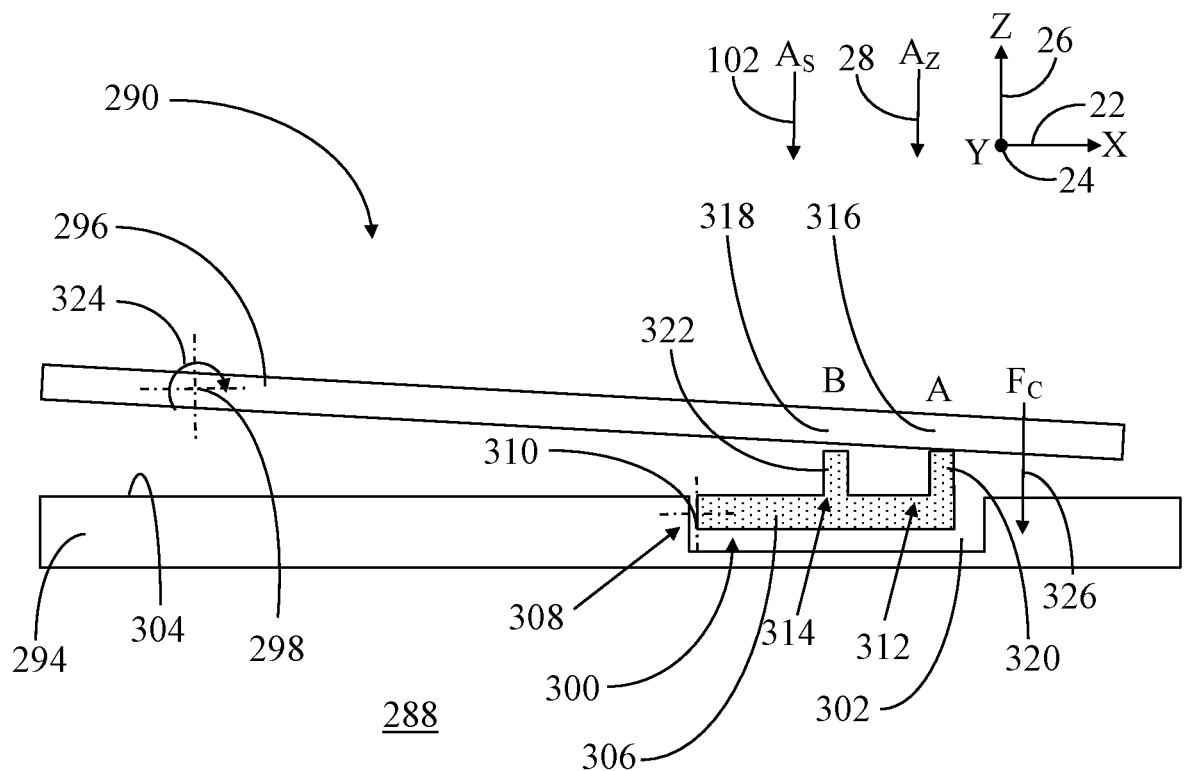
FIG. 14 shows a side view of a MEMS inertial sensor in accordance with another embodiment at a first stop stage.
Figure 15:
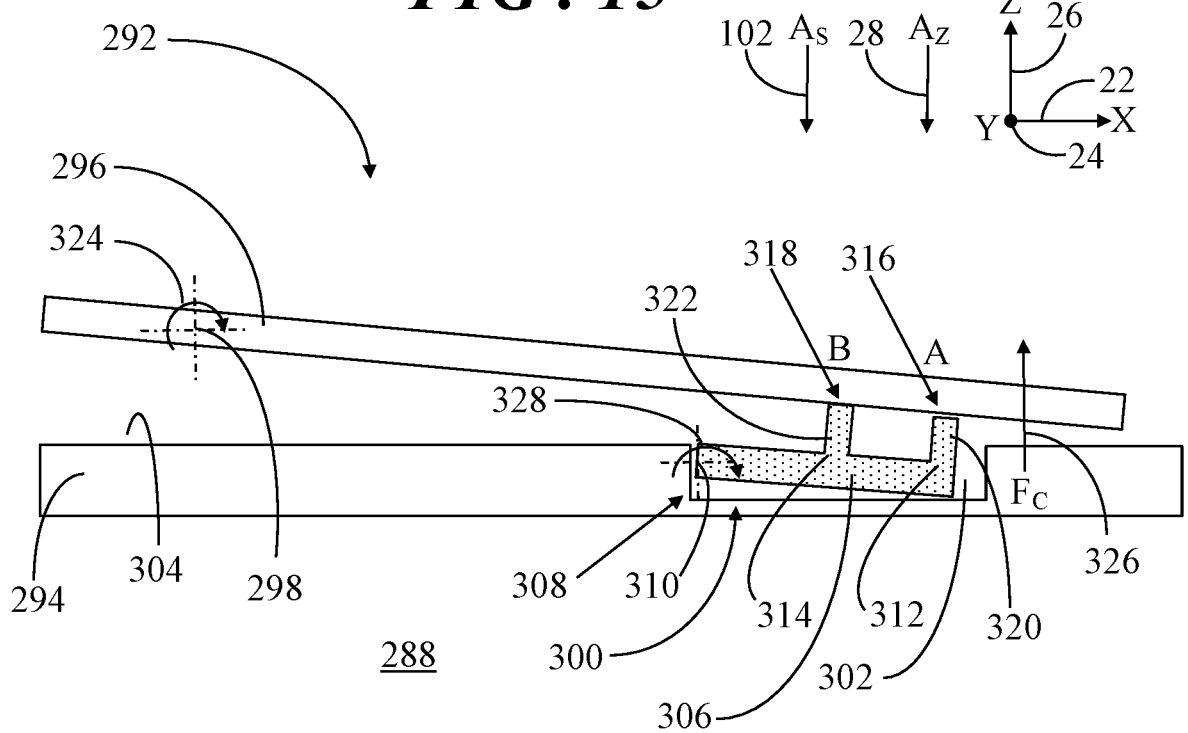
FIG. 15 shows the side view of the MEMS inertial sensor of FIG. 14 at a second stop stage.

Referring now to FIGS. 14-15, FIG. 14 shows a side view of a MEMS inertial sensor 288 in accordance with another embodiment at a first stop stage 290 and FIG. 15 shows the side view of MEMS inertial sensor 288 at a second stop stage 292. MEMS inertial sensor 288 is in the form of a "teeter-totter" type accelerometer and is configured to sense Z-axis acceleration, $A_Z$, 28. Z-axis accelerometer 288 includes a substrate 294, electrode elements (e.g., elements 34, 36 shown in FIG. 1), a suspension anchor (not shown), and a proof mass 296 adapted for rotation about a first axis of rotation 298 in response to Z-axis acceleration 28.

In this example, Z-axis accelerometer 20 includes one or more two-stage motion limit structures 300 (one shown) located in a cavity 302 extending inwardly into substrate 294 from a surface 304 of substrate 294. Motion limit structure 300 includes a cantilevered arm structure 306 flexibly coupled to substrate 294 via torsion springs (not shown) at a pivot location 308. Thus, cantilevered arm structure 306 is configured to pivot about a second axis of rotation 310 at the pivot location 308. In the simplified illustration of FIGS. 14-15, the coupling of cantilevered arm structure 306 with substrate 294 is not explicitly shown. However, those skilled in the art will recognize that that the torsion beams coupling cantilevered arm structure 306 with substrate 294 can be implemented with a wide variety of different types of spring elements.

Arm structure 306 includes first and second contact regions 312, 314 which are laterally displaced away from pivot location 308 in the X-direction corresponding to X-axis 22. Additionally, second contact region 314 is at a position that is closer to pivot location 308 than the position of first contact region 312. A first stop region 316 (labeled "A" in FIGS. 14 and 15) is located on proof mass 296 and a second stop region 318 (labeled "B" in FIGS. 14 and 15) is located on proof mass 296. In this example, a first bump 320 extends upwardly from first contact region 312 of arm structure 306 toward first stop region 316 on proof mass 296 and a second bump 322 extends upwardly from second contact region 314 of arm structure 306 toward second stop region 318 on proof mass 296.

In this alternative Z-axis accelerometer configuration, the two-stage motion limit structure 300 functions similarly to the two-stage motion limit structures discussed above. At first stage 290 shown in FIG. 14, proof mass 296 is being subjected to a Z-axis shock force, $A_S$, 102. When proof mass 296 is subjected to Z-axis shock force 102, proof mass 296 will pivot about first axis of rotation 298, as denoted by an arrow 324. In response to shock force 102 imposed upon proof mass 296 that causes proof mass 296 to pivot, first bump 320 at first contact region 312 will contact first stop region 316 at proof mass 296 with a particular force, referred to herein as a contact force, $F_C$, and represented by a downwardly directed arrow 326. Thus, first contact region 312 and first stop region 316 can be considered a primary stop feature (A).

Second stage 292 shown in FIG. 15 demonstrates that following contact of first bump 320 at first contact region 312 with first stop region 316 and upon a continuation of shock force 102 imposed upon proof mass 296, second bump 322 at second contact region 314 will contact second stop region 318 at proof mass 296. The forcible contact of second contact region 314 with second stop region 318 causes arm structure 306 to pivot at pivot location 308 about second axis of rotation 310, as denoted by an arrow 328. Thus, second contact region 312 and second stop region 318 can be considered a secondary stop feature (B). The pivoting motion of arm structure 306 reduces the magnitude of contact force, $F_C$, 326 (as represented by the upwardly directed arrow) to facilitate separation of first contact region 312 and first stop region 316. Additionally, this reduction of contact force 326 yields a restoring force that can be sufficient to separate second contact region 314 and second stop region 318 to return proof mass 296 to its initial position.

Figure 16:
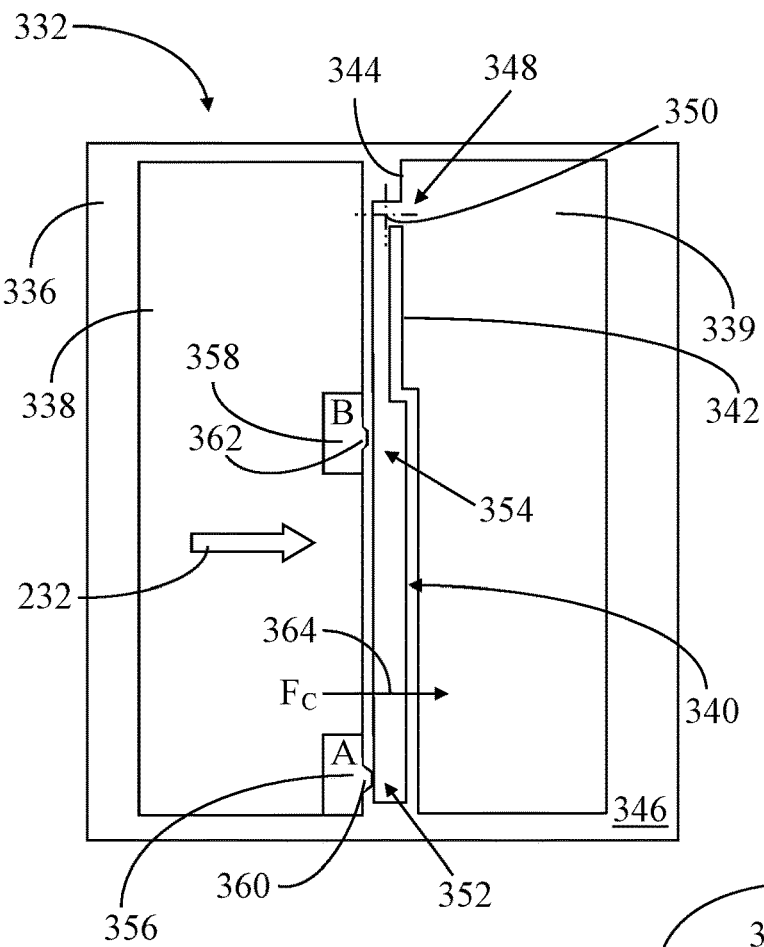
FIG. 16 shows a side view of a MEMS inertial sensor in accordance with another embodiment at a first stop stage.
Figure 17:
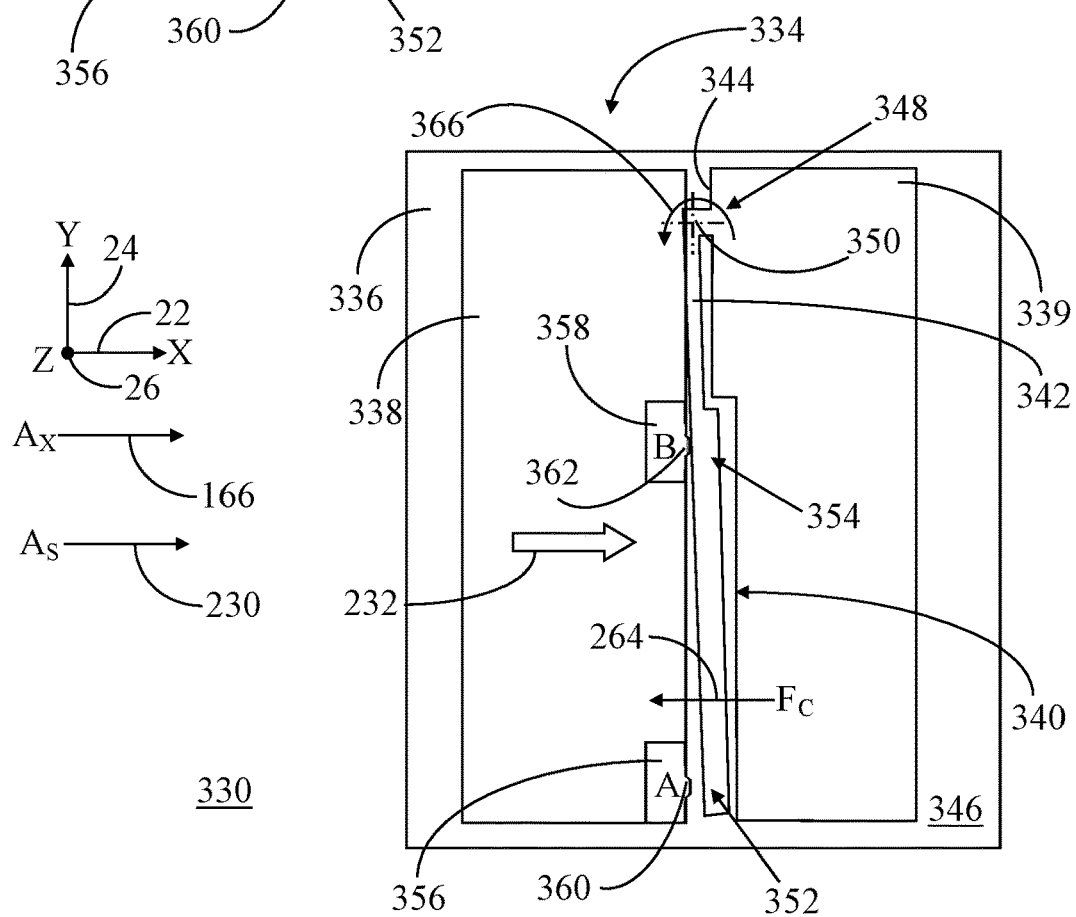
FIG. 17 shows the side view of the MEMS inertial sensor of FIG. 16 at a second stop stage.

Referring to FIGS. 16-17, FIG. 16 shows a side view of a MEMS inertial sensor 330 in accordance with another embodiment at a first stop stage 332 and FIG. 17 shows the side view of MEMS inertial sensor 330 at a second stop stage 334. MEMS inertial sensor 330 is configured to sense X-axis acceleration, $A_X$, 166. X-axis accelerometer 330 includes a substrate 336, electrode elements (e.g., elements 174, 176 shown in FIG. 8), translatory spring suspension elements (not shown), and a proof mass 338 adapted for translational (i.e., lateral motion in the X-direction parallel to X-axis 22) relative to substrate 336.

In this example, X-axis accelerometer 330 includes one or more two-stage motion limit structures 340 (one shown) located proximate proof mass 338. Motion limit structure 340 includes a cantilevered arm structure 342 flexibly coupled to substrate 336. In particular, cantilevered arm structure 342 is coupled to and extends from an edge 344 of an anchoring structure 339 fixed to, or otherwise formed on, a surface 346 of substrate 336 at a pivot location 348. Thus, cantilevered arm structure 342 is configured to pivot about an axis of rotation at pivot location 348.

Arm structure 342 includes first and second contact regions 352, 354 which are laterally displaced away from pivot location 348 in a direction corresponding to Y-axis 24. Additionally, second contact region 354 is at a position that is closer to pivot location 348 than the position of first contact region 352. A first stop region 356 (labeled "A" in FIGS. 16 and 17) is located on proof mass 338 and a second stop region 358 (labeled "B" in FIGS. 16 and 17) is located on proof mass 338. In this example, a first bump 360 extends laterally from first stop region 356 of proof mass 338 toward first contact region 352 on arm structure 342 and a second bump 362 extends laterally from second stop region 358 of proof mass 338 toward second contact region 354 of arm structure 342.

In this alternative X-axis accelerometer configuration, the two-stage motion limit structure 340 functions similarly to the two-stage motion limit structures discussed above. At first stage 332 shown in FIG. 16, proof mass 338 is being subjected to X-axis shock force, $A_S$, 230. When proof mass 338 is subjected to X-axis shock force 230, proof mass 338 will translate in a direction that may be substantially parallel to X-axis 22, as denoted by an arrow 232. In response to shock force 230 imposed upon proof mass 338 that causes proof mass 338 to translate, first bump 360 at first stop region 356 of proof mass 338 will contact first contact region 352 or arm structure 342 with a contact force, $F_C$, and represented by a rightwardly directed arrow 364. Thus, first contact region 352 and first stop region 356 can be considered a primary stop feature (A).

Second stop stage 334 shown in FIG. 17 demonstrates that following contact of first bump 360 at first stop region 356 with first contact region 352 and upon continuation of shock force 230 imposed upon proof mass 338, second bump 362 at second stop region 358 of proof mass 338 will contact second contact region 354 of arm structure 342. The forcible contact of second contact region 354 with second stop region 358 causes arm structure 342 to pivot at pivot location 348 about the axis of rotation, as denoted by an arrow 366. Thus, second contact region 354 and second stop region 358 can be considered a secondary stop feature (B). The pivoting motion of arm structure 342 reduces the magnitude of contact force, $F_C$, 364 (as represented by the leftwardly directed arrow) to facilitate separation of first contact region 352 and first stop region 356. Additionally, this reduction of contact force 364 yields a restoring force that can be sufficient to separate second contact region 354 and second stop region 358 to return proof mass 338 to its initial position.

The inertial sensors shown in FIGS. 1-6 and 8-10 demonstrate configurations in which the motion limit structure is flexibly coupled to the proof mass. Conversely, the inertial sensors shown in FIGS. 14-17 demonstrate configurations in which the motion limit structure is flexibly coupled to a fixed position on the substrate. In either instance, a two-stage motion limit (i.e., stop) configuration having a compliant primary stop feature (A) and a rigid secondary stop feature (B) is achieved.

Various inertial sensors with motion limit structures are illustrated and described herein. However, those of skill in the art would understand, based on the description herein, that a vast number of variations that include the motion limit structure having the primary stop feature (A) and a rigid secondary stop feature (B) may be envisioned. Furthermore, although configurations are depicted in which the motion limit structure is implemented to limit movement of the proof mass in the instance of a shock event along a single axis, it should be understood that multiple limit structures may be implemented within a design to limit movement of the proof mass in the instance of shock events along multiple axes. Still further, although the two-stage motion limit structure is described in connection with an accelerometer it will be understood that the two-stage motion limit structure may be implemented in other inertial sensors (e.g., gyroscopes) and in other MEMS devices having a movable structure that may otherwise be damaged when subjected to a shock force.

An embodiment of a MEMS device comprises a substrate, a proof mass spaced apart from the substrate and capable of moving relative to the substrate, and a motion limit structure. The motion limit structure comprises an arm structure flexibly coupled to a first one of the proof mass and the substrate, the arm structure having a first contact region and a second contact region, wherein in response to a shock force imposed upon the proof mass that causes the proof mass to move, the first contact region is configured to contact a first stop region on a second one of the proof mass and the substrate, and following contact of the first contact region with the first stop region and upon a continuation of the shock force imposed upon the proof mass, the second contact region is configured to contact a second stop region on the second one of the proof mass and the substrate such that contact of the second contact region with the second stop region reduces a contact force between the first contact region and the first stop region.

Another embodiment of a MEMS device comprises a substrate, a proof mass spaced apart from the substrate and capable of moving relative to the substrate, and a motion limit structure. The motion limit structure comprises a cantilevered arm structure having a first end flexibly coupled to a first one of the proof mass and the substrate at a pivot location, the arm structure having a first contact region and a second contact region, the second contact region being positioned closer to the pivot location than the first contact region, wherein in response to a shock force imposed upon the proof mass that causes the proof mass to move, the first contact region is configured to contact a first stop region on a second one of the proof mass and the substrate, and following contact of the first contact region with the first stop region and upon a continuation of the shock force imposed upon the proof mass, the second contact region is configured to contact a second stop region on the second one of the proof mass and the substrate such that contact of the second contact region with the second stop region reduces a contact force between the first contact region and the first stop region.

Another embodiment of a MEMS device comprises a substrate, a proof mass spaced apart from the substrate and capable of moving relative to the substrate, and a motion limit structure. The motion limit structure comprises a cantilevered arm structure having a first end that is flexibly coupled to the proof mass at a pivot location, the cantilevered arm structure having a first contact region and a second contact region, the second contact region being positioned closer to the pivot location than the first contact region, wherein in response to a shock force imposed upon the proof mass that causes the proof mass to move, the first contact region contacts a first stop region anchored to the substrate, following contact of the first contact region with the first stop region and upon a continuation of the shock force imposed upon the proof mass, the cantilevered arm structure pivots at the pivot location and the second contact region contacts a second stop region anchored to the substrate, wherein contact of the second contact region with the second stop region reduces a contact force between the first contact region and the first stop region, and in response to the reduction of the contact force between the first contact region and the first stop region, the first and second contact regions separate from the first and second stop regions, respectively, to return the proof mass to an initial position.

Accordingly, embodiments disclosed herein entail MEMS devices with improved robustness to shock events. More particularly, a MEMS inertial sensor includes one or more motion limit structures having a two-stage stop configuration. The two-stage motion limit structure includes a primary stop feature that makes contact between movable and stationary structures. This primary stop feature (i.e., the first stop stage) has compliance configured to prevent considerable forces being generated between the contact surfaces of the movable and stationary structures. Keeping the contact forces low helps to keep the adhesion force between the contact surfaces of the movable and stationary structures low. The secondary stop feature (i.e., the second stop stage) is more rigid and is configured to stop movement of the moveable structure relative to the stationary structure with higher forces. Additionally, the secondary stop feature is configured to withstand sufficient forces and may therefore limit or reduce the contact force between the contact surface of the movable and stationary structures of the primary stop feature. Additionally, the energy used to compress the primary stop feature can be used to push apart the secondary stop feature. Accordingly, the two-stage stop configuration may reduce the potential for damage to the movable structures and/or the stop features during high-g shock events, and enable the reduction of contact forces between the contact surface of the primary stop feature to thereby limit stiction events. Thus, the two-stage stop configuration having a compliant primary stop feature and a rigid secondary stop feature may result in enhanced performance and a more robust design of a MEMS device.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A microelectromechanical systems (MEMS) device comprising:
    a substrate;
    a proof mass spaced apart from the substrate and capable of moving relative to the substrate, wherein the proof mass is configured to move in a first direction substantially parallel to a surface of the substrate; and
    a motion limit structure comprising an arm structure flexibly coupled to a first one of the proof mass and the substrate, the arm structure extending from the first one of the proof mass and the substrate proximate an edge of the proof mass, the arm structure being configured to pivot about an axis of rotation that is perpendicular to the surface of the substrate, and the arm structure having a first contact region and a second contact region, wherein:
        in response to a shock force imposed upon the proof mass that causes the proof mass to move, the first contact region is configured to contact a first stop region on a second one of the proof mass and the substrate; and
        following contact of the first contact region with the first stop region and upon a continuation of the shock force imposed upon the proof mass, the second contact region is configured to contact a second stop region on the second one of the proof mass and the substrate such that contact of the second contact region with the second stop region reduces a contact force between the first contact region and the first stop region.

2. The MEMS device of claim 1 wherein the arm structure is a cantilevered arm structure having a first end that is flexibly coupled to the first one of the proof mass and the substrate at a pivot location.

3. The MEMS device of claim 1 wherein a first end of the arm structure is flexibly coupled to the first one of the proof mass and the substrate at a pivot location, and the second contact region is positioned closer to the pivot location than the first contact region.

4. The MEMS device of claim 1 wherein:
    one of the first contact region and the first stop region includes a first bump extending toward the other of the first contact region and the first stop region; and
    one of the second contact region and the second stop region includes a second bump extending toward the other of the second contact region and the second stop region.

5. The MEMS device of claim 1 wherein prior to imposition of the shock force on the proof mass, a first gap exists between the first contact region and the first stop region, the first gap having a first gap width, and a second gap exists between the second contact region and the second stop region, the second gap having a second gap width that is greater than the first gap width.

6. The MEMS device of claim 1 wherein:
when the arm structure extends from the proof mass, a pivot location of the axis of rotation is at a junction between the edge of the proof mass and a first end of the arm structure; and
when the arm structure extends from the substrate, the pivot location of the axis of rotation is at a junction between an anchor coupled to the substrate and the first end of the arm structure.

7. The MEMS device of claim 6 wherein:
the first contact region is displaced away from the axis of rotation by a first distance in a second direction parallel to a surface of the substrate, the second direction being perpendicular to the first direction; and
the second contact region is displaced away from the axis of rotation by a second distance in the second direction, the second distance being less than the first distance.

8. The MEMS device of claim 1 wherein the arm structure comprises:
a first segment having a first width parallel to the direction of the movement of the proof mass; and
a second segment longitudinally extending from and aligned with the first segment, wherein the first segment is interposed between the axis of rotation and the second segment, the second segment has a second width parallel to the direction of the movement of the proof mass that is greater than the first width, and the first and second contact regions are located on the second segment.

9. A microelectromechanical systems (MEMS) device comprising:
a substrate;
a proof mass spaced apart from the substrate and capable of moving relative to the substrate, wherein the proof mass is configured to pivot about a first axis of rotation, and the proof mass includes a first section on one side of the first axis of rotation and a second section on an opposing side of the first axis of rotation, the first section being formed with greater mass than the second section; and
a motion limit structure comprising an arm structure flexibly coupled to a first one of the proof mass and the substrate, the arm structure extending from the first one of the proof mass and the substrate proximate the first section of the proof mass, the arm structure is configured to pivot about a second axis of rotation that is parallel to the first axis of rotation, and the arm structure has a first contact region and a second contact region, wherein the first contact region and the first stop region are displaced away from the second axis of rotation by a first distance in a direction parallel to a surface of the substrate, the second contact region and the second stop region are displaced away from the second axis of rotation by a second distance in the direction parallel to the surface of the substrate, the second distance being less than the first distance, wherein:
in response to a shock force imposed upon the proof mass that causes the proof mass to move, the first contact region is configured to contact a first stop region on a second one of the proof mass and the substrate; and
following contact of the first contact region with the first stop region and upon a continuation of the shock force imposed upon the proof mass, the second contact region is configured to contact a second stop region on the second one of the proof mass and the substrate such that contact of the second contact region with the second stop region reduces a contact force between the first contact region and the first stop region.

10. The MEMS device of claim 9 wherein the second axis of rotation is displaced away from the first axis of rotation in a direction parallel to a surface of the substrate.

11. A microelectromechanical systems (MEMS) device comprising:
a substrate;
a proof mass spaced apart from the substrate and capable of moving relative to the substrate, the proof mass is configured to pivot about a first axis of rotation, and the proof mass includes a first section on one side of the first axis of rotation and a second section on an opposing side of the first axis of rotation, the first section being formed with greater mass than the second section; and
a motion limit structure comprising a cantilevered arm structure having a first end flexibly coupled to the proof mass at a pivot location, wherein the arm structure extends from the first section of the proof mass and is configured to pivot about a second axis of rotation that is parallel to the first axis of rotation, the second axis of rotation is displaced away from the first axis of rotation in a direction parallel to a surface of the substrate, and the arm structure has a first contact region and a second contact region, the second contact region being positioned closer to the pivot location than the first contact region, wherein the first contact region and the first stop region are displaced away from the second axis of rotation by a first distance in a direction parallel to a surface of the substrate, the second contact region and the second stop region are displaced away from the second axis of rotation by a second distance in the direction parallel to the surface of the substrate, the second distance being less than the first distance, and wherein:
in response to a shock force imposed upon the proof mass that causes the proof mass to move, the first contact region is configured to contact a first stop region on a second one of the proof mass and the substrate; and
following contact of the first contact region with the first stop region and upon a continuation of the shock force imposed upon the proof mass, the second contact region is configured to contact a second stop region on the second one of the proof mass and the substrate such that contact of the second contact region with the second stop region reduces a contact force between the first contact region and the first stop region.

12. A microelectromechanical systems (MEMS) device comprising:
a substrate;
a proof mass spaced apart from the substrate and capable of moving relative to the substrate, wherein the proof mass is configured to move in a first direction substantially parallel to a surface of the substrate; and
a motion limit structure comprising a cantilevered arm structure having a first end flexibly coupled to a first one of the proof mass and the substrate at a pivot location, the arm structure extending from the first one of the proof mass and the substrate proximate a first edge of the proof mass, the arm structure is configured to pivot about an axis of rotation that is perpendicular to the surface of the substrate, and the arm structure has a first contact region and a second contact region, the second contact region being positioned closer to the pivot location than the first contact region, wherein:

in response to a shock force imposed upon the proof mass that causes the proof mass to move, the first contact region is configured to contact a first stop region on a second one of the proof mass and the substrate; and following contact of the first contact region with the first stop region and upon a continuation of the shock force imposed upon the proof mass, the second contact region is configured to contact a second stop region on the second one of the proof mass and the substrate such that contact of the second contact region with the second stop region reduces a contact force between the first contact region and the first stop region.

13. The MEMS device of claim 12 wherein:

when the arm structure extends from the proof mass, a pivot location of the axis of rotation is at a junction between the edge of the proof mass and a first end of the arm structure; and when the arm structure extends from the substrate, the pivot location of the axis of rotation is at a junction between an anchor coupled to the substrate and the first end of the arm structure.

14. The MEMS device of claim 13 wherein:

the first contact region is displaced away from the axis of rotation by a first distance in a second direction parallel to a surface of the substrate, the second direction being perpendicular to the first direction; and the second contact region is displaced away from the axis of rotation by a second distance in the second direction, the second distance being less than the first distance.

15. The MEMS device of claim 12 wherein the arm structure comprises:

a first segment having a first width parallel to the direction of the movement of the proof mass; and a second segment longitudinally extending from and aligned with the first segment, wherein the first segment is interposed between the axis of rotation and the second segment, the second segment has a second width parallel to the direction of the movement of the proof mass that is greater than the first width, and the first and second contact regions are located on the second segment.

* * * * *